Figure 1:
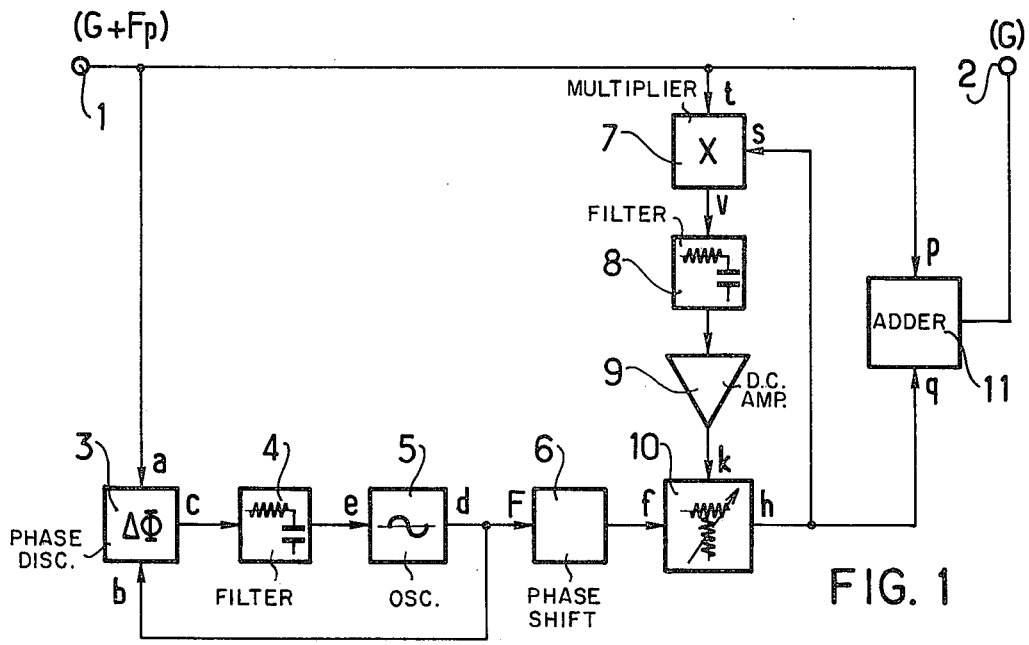

_United States Patent_ [19]

Duval et al.

[11] 3,949,173

[45] Apr. 6, 1976

[54] DEVICE FOR THE SUPPRESSION OF A PILOT FREQUENCY IN A MULTIPLEX TRANSMISSION SYSTEM

[75] Inventors: Georges Duval, Boulogne; Robert Bonneton, Charenton; Christian Poinas, Paris, all of France

[73] Assignee: Compagnie Industrielle des Telecommunications Cit-Alcatel, France

[22] Filed: Oct. 18, 1973

[21] Appl. No.: 407,451

[30] Foreign Application Priority Data
Oct. 18, 1972 France .............................. 72.36925

[52] U.S. Cl............................................. 179/15 BP
[51] Int. Cl.[2] ..................................... H04J 1/10
[58] Field of Search ... 179/15 BP, 1 P, 81 A, 170.6; 343/180; 178/59; 325/21, 52

[56] References Cited
UNITED STATES PATENTS

| | | | |
|---|---|---|---|
| 716,955 | 12/1902 | Stone | 343/180 |
| 1,256,889 | 2/1918 | Espenschied | 343/180 |
| 1,578,490 | 3/1926 | Weagant | 343/180 |
| 3,696,429 | 10/1972 | Tressa | 343/180 |
| 3,714,595 | 1/1973 | Denenberg | 329/50 |
| 3,810,182 | 5/1974 | White | 343/180 |

OTHER PUBLICATIONS

Western Electric Engineering, Vol. 16, No. 1, Jan. 1972, "A Method of Suppressing Pilot Frequencies . . .", by J. Grossman.
Electronic Design, Vol. 12, No. 15, July 1964, "A Primer on Phase-Locked Loops", by W. Lew.
IEEE Transactions on Broadcast and Television Receivers, Vol. BTR-16, No. 4, Nov. 1970, "On An Inductorless FM Stereo Multiplex Circuit . . .", by W. Padgett.

_Primary Examiner_—David L. Stewart
_Attorney, Agent, or Firm_—Craig & Antonelli

[57] ABSTRACT

A device for suppressing a pilot wave in a spectrum of frequencies by subtraction of an auxiliary frequency adjusted in frequency, in phase, and in amplitude to adequate values, used in frequency multiplex telephone transmission systems, containing two pilot frequencies in cases where maintaining either one or several of these frequencies would lead to disturbances.

14 Claims, 2 Drawing Figures

FIG. 1

DEVICE FOR THE SUPPRESSION OF A PILOT FREQUENCY IN A MULTIPLEX TRANSMISSION SYSTEM

The present invention relates to the field of multiplex telephone transmissions. It is concerned with a device for suppressing a pilot wave in a spectrum of frequencies by subtraction therefrom of an auxiliary frequency adjusted in frequency, phase, and in amplitude to adequate values. It is utilized in frequency multiplex telephone transmission systems comprising pilot frequencies in the cases where maintaining one or several of these frequencies would lead to or result in disturbances.

In standardized frequency multiplex telephone systems, with a frequency spectrum carrying the data to be transmitted, it is known to add pilot frequencies for the purpose of supervision and control of the checking of the repeaters, etc. These frequencies are transmitted either in an "interband" between channels or in the invervals which are left free between groups of channels.

There arise circumstances where the suppression of these pilot frequencies is indispensable to avoid the risk of causing disturbances in the passage of one channel or a group of channels from one system to another, for example, when passing one boundary with a first frequency value of one side (84.080 kHz) and another value of the other side (84.140 kHz).

It is known to utilize for this purpose a quartz band suppression filter having a very narrow band (frequency rejector). But the filters of this type which comprise several quartz elements are costly and fragile.

A result which is at least equivalent to use of the rejector filer can be obtained with the aid of means that are less costly and more reliable, by effecting the synthesis of one frequency wave equal to the pilot frequency to be suppressed and controlling this synthesized wave in phase and in level. When the wave is applied to an analog adder receiving the complete incident spectrum, this acts to nullify by subtraction the pilot frequency which has been transmitted in a manner such as to retransmit the spectrum less the aforementioned pilot frequency.

The control of the auxiliary frequency in frequency and in phase is carried out by means of a first control loop comprising a voltage controlled oscillator; the control in the level is carried out on this frequency which is generated by the first loop by means of a control loop comprising an attenuator which is controllable by means of the voltage output of the control loop, or an equivalent element (an amplifier with variable amplification).

Figure 2:
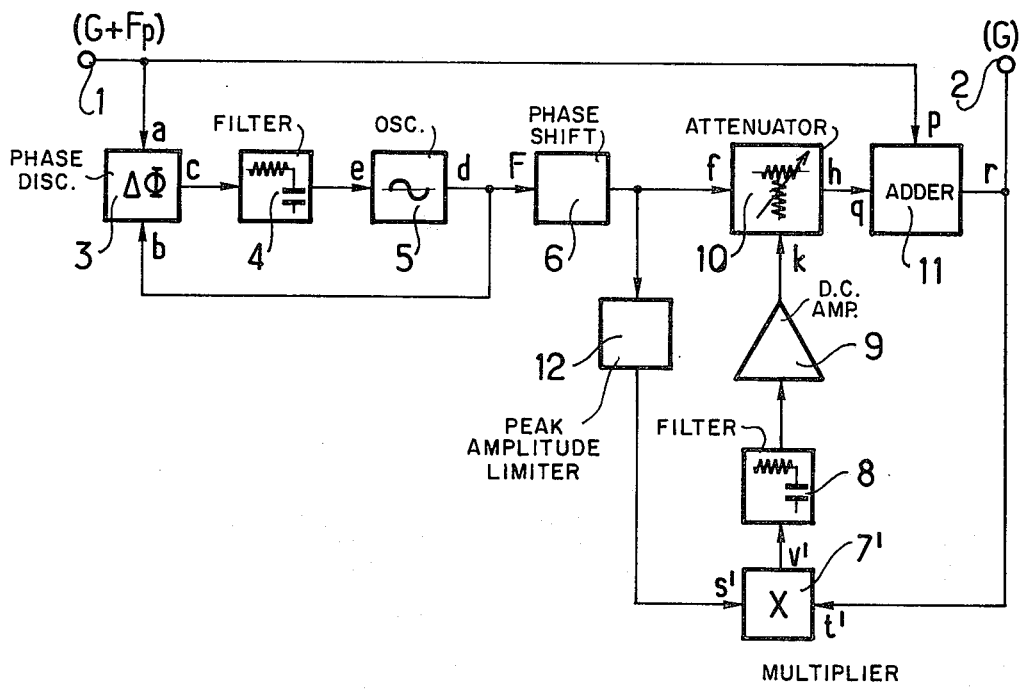

The present invention will now be described in further detail hereinafter with reference to the accompanying drawing, wherein:

FIG. 1 is a schematic block diagram of a first embodiment of the present invention, and FIG. 2 is a schematic block diagram of a second embodiment of the present invention.

In FIG. 1 a group of frequencies G, for example, a primary base group of 60–108 kHz, comprising a pilot frequency Fp, for example, 84.080 kHz, arrives on a terminal 1. From a terminal 2 issues the same group G, but freed from the pilot frequency Fp.

A phase discriminator 3 receives on a terminal $a$ total incident spectrum G + Fp. On a terminal $b$ it receives a wave from the output $d$ of a voltage controlled oscillator 5. In the case of obtaining synchronization of the control loop, there issues from the phase discriminator 3 at output $c$ a spectrum whose direct current component as a function of the phase spacing of the incident signals is filtered by means of a narrow band low pass filter 4, preferably of the RC-type, is applied at input $e$ for automatic frequency control of the oscillator 5. The existence of the spectrum G including the frequency Fp does not impede the locking-in or synchronization of the control loop. It is known that a loop formed by the members 3, 4, and 5 furnishes at the output of the controlled oscillator 5 a frequency F which is equal to the incident frequency Fp, but is in phase quadrature with Fp.

The frequency provided at the output $d$ of the oscillator 5 is applied to a phase shifter 6 which shifts the frequency F present at its input in quadrature with the pilot frequency Fp, and furnishes at its output the same frequency F in phase opposition with Fp.

In the state of synchronization, the phase discriminator 3 furnishes a direct current voltage as a constant term of the product of the voltage of the frequency Fp by the frequency voltage F which is identical to Fp. This direct current voltage is accompanied by residual alternating voltages which are eliminated by the filter 4. The filter 4 is advantageously provided with a cut-off frequency $\Delta F$ equal to half the band width which one would have given to a frequency rejector filter with a band Fp $\pm \Delta F$, for example, $\Delta F = 2.5$ Hz.

In general, it is necessary, in order to obtain synchronization of a frequency control loop, to proceed with a preliminary operation of a frequency scanning bringing the controllable oscillator to lock in providing the required control. This operation is unnecessary here in view of the fact that, with the input frequency being constant in principle and effectively varying within very narrow limits, the oscillator 5 is stabilized approximately by virtue of its construction by means of a quartz element Q in the range of capture of the control loop. What is involved here is a non-rigorous stabilization leaving the field free for the action of the regulation of the control. Furthermore, the quartz element Q is of a common type and has low price. For an adequate regulation of the oscillator 5, the frequency produced is pure enough so as not to require filtering. The first control loop may also comprise a direct current amplifier which has not been shown in the figure.

The second control loop comprises an analog multiplier 7 providing a direct current output signal, a low pass RC-type filter 8, a direct current amplifier 9, and a variable attenuator 10 which is controllable by an applied voltage. The device further comprises an adder 11 with inputs $p$ and $q$ and with an output 2.

The attenuator 10 receives at $f$ the frequency voltage F issuing from the phase shifter 6 and transmits at its output $h$ a reduced voltage to the terminal $s$ of the multiplier 7, which receives on a second input $t$ the incident spectrum G + Fp and furnishes at its output $v$ a direct current signal accompanied by alternating voltages filtered by an RC filter 8. The output of the filter 8 is a direct current signal which is applied to a direct current amplifier 9 whose output is connected to a control terminal $k$ of the variable attenuator 10.

The attenuator 10 may comprise either one or several cells equipped with field effect transistors; however, within the framework of the present invention, other attenuating cells with electronic control are usable as well. The low pass filter 8 may be identical to the low pass filter 4, or possibly, a little larger (cut-off frequency in the order of 10 Hz, for example).

The multiplier 7 receives on its terminal $t$ a complex spectrum where the pilot frequency Fp is represented. It cannot produce a direct current voltage passing the low pass filter 8 but produces the product between the frequency Fp contained in the spectrum applied to input $t$ and the frequency F equal to Fp applied to input $s$, which passes filter 8. The essential filtering effect is thus supplied by the multiplier 7 while the low pass filter 8 simply serves to complete it. The multiplier 7 furnishing at the output principally a direct current signal may consist of a member identical or analogous to be phase discriminator 3.

Since the level control loop formed by elements 7, 8, 9, and 10 converges toward an error signal at output $v$ which is as small as possible (in view of the gain of the loop), it follows that at the equilibrium condition the voltage at input $s$ which is identical to the voltage at input $q$ is very close to the voltage at the frequency Fp on the terminal $t$, which is to say on the terminal $p$ of the adder 11. At the output 2 of the adding means 11 there is therefore effected an elimination to a very large extent of the voltage having the frequency Fp by the auxiliary voltage F which is in phase opposition thereto and controlled in level.

The attenuation of Fp which may be obtained in this manner is in the order of 40 dB, which is considered as altogether satisfactory in practice. However, since the erasing of the frequency Fp is not total, the signal present at the terminal 2 comprises therefore the group of frequencies G and a weak residual voltage of the pilot frequency Fp. In a second embodiment of the present invention, this residual voltage existing at the output of the adding means 11 is used as an error signal for the control in level of the auxiliary voltage F.

This second embodiment is advantageous because of the fact that the adder 11 is included in this case in the control loop; this leads to a more reliable control since the variations in time, which are practically unavoidable, of the characteristics of the adder 11 are then automatically compensated for.

In FIG. 2 the elements which are common to the first and second embodiments according to the present invention appear with the same reference numerals as were used in FIG. 1.

The incident spectrum formed of a group of frequencies G and a pilot frequency Fp arrives on a terminal 1 and the group G, freed from the pilot frequency Fp, issues through a terminal 2.

The blocks 3, 4, and 5 of the first control loop followed by the phase shifter 6 allow for synthesizing a wave F of the same frequency as the pilot frequency Fp, in phase opposition with Fp, as previously described.

The second control loop comprises an attenuator 10 controllable by a voltage applied thereto, an analog adding means 11, an analog multiplier 7', a low pass RC-type filter 8, and a direct current amplifier 9.

The device further comprises a peak amplitude limiter 12 between the output of the phase shifter 6 and an input $s'$ of the multiplier 7'. The attenuator 10 receives at input $f$ the frequency voltage F issuing from the shifter 6 and transmits through its output $h$ an attenuated voltage to the terminal $q$ of the analog adding means 11. The adding means 11, which receives on a second input terminal $p$ the incident spectrum G + Fp, furnishes at its output $r$ the frequency group G accompanied by a residual voltage corresponding to the difference between the pilot frequency Fp and the frequency signal F issuing from the attenuator 10. The output $r$ of the analog adding means 11 is connected to an input $t'$ of the multiplier 7' which receives on a second input $s'$ the signal issuing from the phase shifter 6 and peak-limited by the peak amplitude limiter 12. The multiplier 7' furnishes at its output $v'$ a direct current signal which contains the information on the level of the aforementioned residual voltage accompanied by alternating voltages which are eliminated by an RC filter 8 which applies the direct current signal to a direct current amplifier 9 whose output is connected to a control terminal $k$ of the attenuator 10.

The multiplier 7' receives on its terminal $t'$ a complex spectrum where there appears a residual voltage of the pilot frequency Fp. In order to extract from this complex spectrum a direct current signal proportional to the level of this residual voltage, it is necessary to apply on the second terminal $s'$ of the multiplier a wave which is controlled in frequency and in phase with respect to the pilot frequency Fp, but exempt from any level variation. For this purpose the peak limiter 12 is inserted between the output the phase shifter 6 and the terminal $s'$ of the multiplier 7'.

A low pass filter 8 completes the filtering effected by the multiplier, as is the case in the first device.

The present invention has been described with reference to two embodiments that have been chosen by way of example, but it is evident that modifications relative to details could be added thereto, and/or that certain means could be replaced by other technically equivalent means without departing from the spirit and scope of the present invention.

More particularly, the phase shifter 6 could advantageously be replaced by an integrator with the quadrature shift being carried out in this case in an exact fashion over the entire frequency band, and no longer only for a monochromatic line.

The present invention has been described herein within the framework of a multiplex transmission system designed for the supression of a pilot wave, but it is understood that it can be applied in a general manner for the purpose of the attenuation of a fixed frequency within a composite spectrum.

What is claimed is:

1. A system for the suppression of a pilot frequency in an incident spectrum of frequencies transmitted in a multiplex transmission system, comprising
    a phase discriminator having first and second inputs and an output, said first input being connected to receive said spectrum of frequencies including said pilot frequency,
    a voltage controlled oscillator having a control input connected to the output of said phase discriminator and an output connected to said second input of said phase discriminator,
    a phase shifter connected to the output of said voltage controlled oscillator,
    a voltage controlled attenuator connected to the output of said phase shifter,
    adding means for combining the output of said attenuator and said spectrum of frequencies to eliminate said pilot frequency therefrom, and
    control means for receiving the output of said attenuator and said spectrum of frequencies including said pilot frequency and for generating therefrom a signal to control said attenuator.

2. A system as defined in claim 1 wherein said voltage controlled oscillator is tuned to a frequency close to the synchronization frequency of the control loop formed by said phase discriminator and said oscillator.

3. A system as defined in claim 1 wherein said control means includes a multiplier having a first input connected to receive said frequency spectrum including said pilot frequency and a second input connected to the output of said attenuator, the output of said multiplier being applied in control of said attenuator.

4. A system as defined in claim 1 wherein a first low pass filter is connected between the output of said phase discriminator and the control input of said oscillator.

5. A system as defined in claim 4 wherein said voltage controlled oscillator is tuned to a frequency close to the synchronization frequency of the control loop formed by said phase discriminator and said oscillator.

6. A system as defined in claim 4 wherein a second low pass filter is connected between the output of said multiplier and the control input of said attenuator.

7. A system as defined in claim 6 wherein said phase shifter consists of an integrator.

8. A system for the suppression of a pilot frequency in an incident spectrum of frequencies transmitted in a multiplex transmission system, comprising
 a phase discriminator having first and second inputs and an output, said first input being connected to receive said spectrum of frequencies including said pilot frequency,
 a voltage controlled oscillator having a control input connected to the output of said phase discriminator and an output connected to said second input of said phase discriminator,
 a phase shifter connected to the output of said voltage controlled oscillator,
 a voltage controlled attenuator connected to the output of said phase shifter,
 adding means for combining the output of said attenuator and said spectrum of frequencies to eliminate said pilot frequency therefrom, and
 control means for receiving the output of said phase shifter and said adding means and for generating therefrom a signal to control said attenuator.

9. A system as defined in claim 8 wherein said voltage controlled oscillator is turned to a frequency close to the synchronization frequency of the control loop formed by said phase discriminator and said oscillator.

10. A system as defined in claim 8 wherein said control means includes a multiplier having a first input connected to the output of said adding means and a second input connected to the output of said phase shifter by way of a peak amplitude limiter, the output of said multiplier being applied in control of said attenuator.

11. A system as defined in claim 8 wherein a first low pass filter is connected between the output of said phase discriminator and the control input of said oscillator.

12. A system as defined in claim 11 wherein said voltage controlled oscillator is tuned to a frequency close to the synchronization frequency of the control loop formed by said phase discriminator and said oscillator.

13. A system as defined in claim 11 wherein a second low pass filter is connected between the output of said multiplier and the control input of said attenuator.

14. A system as defined in claim 13, wherein said phase shifter consists of an integrator.

* * * * *